US009865667B2

(12) United States Patent
Gil et al.

(10) Patent No.: US 9,865,667 B2
(45) Date of Patent: Jan. 9, 2018

(54) ORGANIC LIGHT-EMITTING DIODE DISPLAY AND MANUFACTURING METHOD THEREOF

(71) Applicant: Samsung Display Co., Ltd., Yongin-si, Gyeonggi-do (KR)

(72) Inventors: Elly Gil, Seoul (KR); Seung Gyu Tae, Osan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 101 days.

(21) Appl. No.: 14/924,556

(22) Filed: Oct. 27, 2015

(65) Prior Publication Data
US 2016/0284267 A1    Sep. 29, 2016

(30) Foreign Application Priority Data
Mar. 23, 2015 (KR) ................ 10-2015-0040042

(51) Int. Cl.
*G09G 1/06* (2006.01)
*H01L 27/32* (2006.01)
*G09G 3/3233* (2016.01)

(52) U.S. Cl.
CPC ....... *H01L 27/3265* (2013.01); *G09G 3/3233* (2013.01); *H01L 27/3276* (2013.01); *G09G 2300/043* (2013.01); *G09G 2300/0426* (2013.01); *G09G 2300/0861* (2013.01); *G09G 2310/0262* (2013.01); *H01L 27/3262* (2013.01); *H01L 2227/323* (2013.01)

(58) Field of Classification Search
CPC ..... G09G 2300/0426; G09G 2300/043; G09G 2300/0861; G09G 2310/0262; G09G 3/3233; H01L 2227/323; H01L 27/3262; H01L 27/3265; H01L 27/3276
See application file for complete search history.

(56) References Cited

U.S. PATENT DOCUMENTS

2014/0187001 A1* 7/2014 Guo ................. H01L 29/66765
                                                             438/158
2014/0332761 A1* 11/2014 Kim .................... H01L 27/3262
                                                             257/40

FOREIGN PATENT DOCUMENTS

| KR | 10-2012-0010824 A | 2/2012 |
| KR | 10-2013-0110987 A | 10/2013 |
| KR | 10-2014-0018623 A | 2/2014 |
| KR | 10-2014-0045170 A | 4/2014 |

* cited by examiner

*Primary Examiner* — Insa Sadio
(74) *Attorney, Agent, or Firm* — Knobbe Martens Olson & Bear LLP

(57) ABSTRACT

An organic light-emitting diode (OLED) display and a method of manufacturing thereof are disclosed. In one aspect, the display includes a scan line formed over a substrate and configured to provide a scan signal. An initialization voltage line has substantially the same pattern as the scan line and is insulated from the scan line. A data line crosses the scan line and is configured to provide a data voltage. A switching transistor is electrically connected to the scan line and the data line, and a driving transistor is electrically connected to the switching transistor and includes a driving gate electrode. A storage capacitor includes a first storage electrode and a second storage electrode overlapping the first storage electrode, wherein the first storage electrode and the driving gate electrode are integrally formed.

20 Claims, 16 Drawing Sheets

ORGANIC LIGHT-EMITTING DIODE DISPLAY AND MANUFACTURING METHOD THEREOF

CROSS-REFERENCE TO RELATED APPLICATION

This application claims priority to and the benefit of Korean Patent Application No. 10-2015-0040042 filed in the Korean Intellectual Property Office on Mar. 23, 2015, the entire contents of which are incorporated herein by reference.

BACKGROUND

Field

The described technology generally relates to an organic light-emitting diode display and a manufacturing method thereof.

Description of the Related Technology

An organic light-emitting diode (OLED) includes two electrodes and an organic light emitting layer in between. Electrons injected from a cathode electrode and holes injected from an anode electrode are bonded to each other in the organic light-emitting layer to form excitons, and light is emitted while the excitons discharge energy.

An OLED display includes a matrix of pixels each including an OLED formed of the cathode, the anode, and the organic light-emitting layer. A plurality of transistors and capacitors for driving the OLED together form a pixel circuit. The plurality of transistors include a switching transistor and a driving transistor.

In the OLED display, the combination of transistors, capacitors and organic emission layer require many photolithographic masks to be used. Production of each mask is added cost, thus increasing overall manufacturing costs.

Also, when a high resolution OLED display is manufactured, there may be insufficient space for the desired capacitor.

The above information disclosed in this Background section is only for enhancement of understanding of the background of the disclosure and therefore it can contain information that does not constitute the prior art that is already known in this country to a person of ordinary skill in the art.

SUMMARY OF CERTAIN INVENTIVE ASPECTS

The described technology generally relates to an OLED display that can reduce the manufacturing cost by reducing at least one mask and simultaneously realizing sufficient capacitance, and a manufacturing method thereof.

Another aspect is an OLED display that includes: a substrate including a pixel area displaying an image and a peripheral area enclosing the pixel area; a scan line formed on the substrate and transmitting a scan signal; an initialization voltage line formed with the same pattern as the scan line and insulated from the scan line; a data line and a driving voltage line crossing the scan line and respectively transmitting a data voltage and a driving voltage; a switching transistor connected to the scan line and the data line; a driving transistor connected to the switching transistor and including a driving gate electrode; a second storage electrode overlapping a first storage electrode as a driving gate electrode and extending from the driving voltage line; and an OLED electrically connected to the driving transistor, wherein the initialization voltage line transmits an initialization voltage initializing the driving transistor and the initialization voltage line exposes a part of the scan line in the peripheral area.

A first gate insulating layer formed on the substrate and a second gate insulating layer covering the scan line formed on the first gate insulating layer can be further included, and the initialization voltage line can be formed on the second gate insulating layer.

An interlayer insulating layer covering the second gate insulating layer and the initialization voltage line can be further included, and the second storage electrode, the driving voltage line, and the data line can be formed on the interlayer insulating layer.

The driving voltage line can include a first driving voltage line parallel to the data line and a second driving voltage line crossing the data line, the first driving voltage line can be formed with the same layer as the data line, and the second driving voltage line can be formed with a different layer from the scan line.

The OLED can include a pixel electrode electrically connected to the driving transistor, an organic emission layer formed on the pixel electrode, and a common electrode formed on the organic emission layer, and the second driving voltage line can be formed with the same layer as the pixel electrode.

A previous scan line formed with the same layer as the scan line and transmitting a previous scan signal, and a floating transistor formed in the peripheral area and turned on depending on the previous scan signal to transmit the initialization voltage, can be further included.

A peripheral initialization connecting member connecting the drain electrode of the floating transistor to the initialization voltage line can be further included, and the peripheral initialization connecting member can be formed with the same layer as the data line.

A semiconductor formed on the substrate and including a switching channel of the switching transistor and a driving channel of the driving transistor separated from each other can be further included, the driving channel can overlap the driving gate electrode, and the driving channel can be curved on a plane.

Another aspect is a manufacturing method of an OLED display that includes: sequentially depositing a first gate insulating layer, a first gate metal layer, a second gate insulating layer, and a second gate metal layer on a substrate; etching the first gate metal layer and second gate metal layer by using a half-tone mask to simultaneously form a scan line, a first storage electrode, and an initialization voltage line; forming an interlayer insulating layer on the initialization voltage line and the second gate insulating layer; forming a data line, a first driving voltage line, and a second storage electrode on the interlayer insulating layer; forming a passivation layer covering the data line, the first driving voltage line, and the second storage electrode; and forming an OLED on the passivation layer, wherein the initialization voltage line is formed with the same pattern as the scan line on the scan line.

The substrate can include a pixel area displaying an image and a peripheral area enclosing the pixel area, and the step of simultaneously forming the scan line, the first storage electrode, and the initialization voltage line can include: forming a first photosensitive film in a region corresponding to the scan line of the pixel area and a second photosensitive film in a region corresponding to the driving gate electrode and a region corresponding to a part of the scan line of the peripheral area by using a half-tone mask; simultaneously etching the first gate metal layer and the second gate metal layer by using the first photosensitive film and the second photosensitive film as an etching mask to form the scan line and the initialization voltage line with the same pattern; removing the second photosensitive film; and etching the second gate metal layer by using the first photosensitive film as an etching mask to etch the part of the initialization voltage line formed in the peripheral area.

A thickness of the first photosensitive film can be larger than a thickness of the second photosensitive film.

The step of forming the OLED can include forming a pixel electrode on the passivation layer, forming an organic emission layer on the pixel electrode, and forming a common electrode on the organic emission layer, a second driving voltage line crossing the first driving voltage line can be formed in the step of forming the pixel electrode, and the first driving voltage line and the second driving voltage line can be electrically connected to each other.

Another aspect is an organic light-emitting diode (OLED) display, comprising: a substrate including a pixel area configured to display an image and a peripheral area surrounding the pixel area; a scan line formed over the substrate and configured to provide a scan signal; an initialization voltage line having substantially the same pattern as the scan line and insulated from the scan line; a data line crossing the scan line and configured to provide a data voltage; a driving voltage line crossing the scan line and configured to provide a driving voltage; a switching transistor electrically connected to the scan line and the data line; a driving transistor electrically connected to the switching transistor and including a driving gate electrode; a storage capacitor including a first storage electrode and a second storage electrode overlapping the first storage electrode, wherein the first storage electrode and the driving gate electrode are integrally formed, and wherein the second storage electrode extends from the driving voltage line; and an OLED electrically connected to the driving transistor, wherein the initialization voltage line is configured provide an initialization voltage to initialize the driving transistor, and wherein the initialization voltage line exposes at least a first portion of the scan line in the peripheral area.

The above OLED display further comprises: a first gate insulating layer formed over the substrate; and a second gate insulating layer formed over a second portion of the scan line formed over the first gate insulating layer, wherein the initialization voltage line is formed over the second gate insulating layer.

The above OLED display further comprises an interlayer insulating layer formed over the second gate insulating layer and the initialization voltage line, wherein the second storage electrode, the driving voltage line, and the data line are formed over the interlayer insulating layer.

In the above OLED display, the driving voltage line includes a first driving voltage line substantially parallel to the data line and a second driving voltage line crossing the data line, wherein the first driving voltage line is formed on the same layer as the data line, and wherein the second driving voltage line is formed on a different layer than the scan line.

In the above OLED display, the OLED includes: a pixel electrode electrically connected to the driving transistor; an organic emission layer formed over the pixel electrode; and a common electrode formed over the organic emission layer, wherein the second driving voltage line is formed on the same layer as the pixel electrode.

The above OLED display further comprises: a previous scan line formed on the same layer as the scan line and configured to provide a previous scan signal; and a floating transistor formed in the peripheral area and configured to be turned on based on the previous scan signal so as to provide the initialization voltage.

The above OLED display further comprises a peripheral initialization connecting member connecting the drain electrode of the floating transistor to the initialization voltage line, wherein the peripheral initialization connecting member is formed on the same layer as the data line.

The above OLED display further comprises a semiconductor formed over the substrate and including a switching channel of the switching transistor and a driving channel of the driving transistor electrically separated from each other, wherein the driving channel overlaps the driving gate electrode, and wherein the driving channel is curved.

Another aspect is a method for manufacturing an organic light-emitting diode display comprising: sequentially depositing a first gate insulating layer, a first gate metal layer, a second gate insulating layer, and a second gate metal layer over a substrate; etching the first gate metal layer and second gate metal layer with a first half-tone mask to concurrently form a scan line, a first storage electrode, and an initialization voltage line; forming an interlayer insulating layer over the initialization voltage line and the second gate insulating layer; forming a data line, a first driving voltage line, and a second storage electrode over the interlayer insulating layer; forming a passivation layer over the data line, the first driving voltage line, and the second storage electrode; and forming an OLED over the passivation layer, wherein a portion of the initialization voltage line formed over the scan line is formed having substantially the same pattern as the scan line.

In the above method, the substrate includes a pixel area configured to display an image and a peripheral area surrounding the pixel area, wherein the etching includes: forming a first photosensitive film in a region corresponding to the scan line of the pixel area; forming a second photosensitive film in a region corresponding to the driving gate electrode and a region corresponding to a portion of the scan line of the peripheral area with a second half-tone mask; concurrently etching the first gate metal layer and the second gate metal layer with the first photosensitive film and the second photosensitive film as an etching mask to form the scan line and the initialization voltage line having substantially the same pattern; removing the second photosensitive film; and etching the second gate metal layer with the first photosensitive film as an etching mask to etch a portion of the initialization voltage line formed in the peripheral area.

In the above method, the thickness of the first photosensitive film is greater than the thickness of the second photosensitive film.

In the above method, forming the OLED includes: forming a pixel electrode over the passivation layer; forming an organic emission layer over the pixel electrode; and forming a common electrode on the organic emission layer, wherein a second driving voltage line crossing the first driving voltage line is formed during the forming of the pixel electrode, and wherein the first driving voltage line and the second driving voltage line are electrically connected to each other.

In the above method, the second driving voltage line and the pixel electrode are formed on the same layer.

In the above method, the second driving voltage line and the scan line are formed on different layers.

Another aspect is an organic light-emitting diode (OLED) display, comprising: a substrate; a driving voltage line formed over the substrate and configured to provide a driving voltage; a storage capacitor including a first storage electrode and a second storage electrode overlapping the first storage electrode, wherein the second storage electrode extends from the driving voltage line; a driving transistor electrically connected to a data line and the driving voltage line and including a driving gate electrode, wherein the first storage electrode and the driving gate electrode are integrally formed; and an OLED electrically connected to the driving transistor and including a pixel electrode, wherein the driving voltage line includes a first driving voltage line and a second driving voltage line formed over the first driving voltage line, and wherein the second driving voltage line is formed on the same layer as the pixel electrode.

In the above OLED display, the substrate includes a pixel area and a peripheral area surrounding the pixel area, wherein the OLED display further comprises: a switching transistor electrically connected the data line; a scan line electrically connected to the switching transistor and configured to provide a scan signal to the switching transistor; and an initialization voltage line having substantially the same pattern as the scan line and insulated from the scan line, wherein the initialization voltage line is configured provide an initialization voltage to initialize the driving transistor, and wherein the initialization voltage line exposes at least a first portion of the scan line in the peripheral area.

The above OLED display further comprises: a first gate insulating layer formed over the substrate; and a second gate insulating layer formed over a second portion of the scan line formed over the first gate insulating layer, wherein the initialization voltage line is formed over the second gate insulating layer.

In the above OLED display, the first driving voltage line is formed on the same layer as the data line, wherein the second driving voltage line is formed on a different layer than the scan line.

The above OLED display further comprises: a previous scan line formed on the same layer as the scan line and configured to provide a previous scan signal; and a floating transistor formed in the peripheral area and configured to be turned on based on the previous scan signal so as to provide the initialization voltage.

The above OLED display further comprises a peripheral initialization connecting member connecting the drain electrode of the floating transistor to the initialization voltage line, wherein the peripheral initialization connecting member is formed on the same layer as the data line.

According to at least one of the disclosed embodiments, the scan line and the initialization voltage line are concurrently formed by using one half-tone mask, thereby reducing the manufacturing cost by reducing the number of masks used.

Further, by forming the second driving voltage line as the same layer as the pixel electrode, the first storage electrode can be large, thereby improving the capacitance.

DETAILED DESCRIPTION OF CERTAIN INVENTIVE EMBODIMENTS

Figure 1:
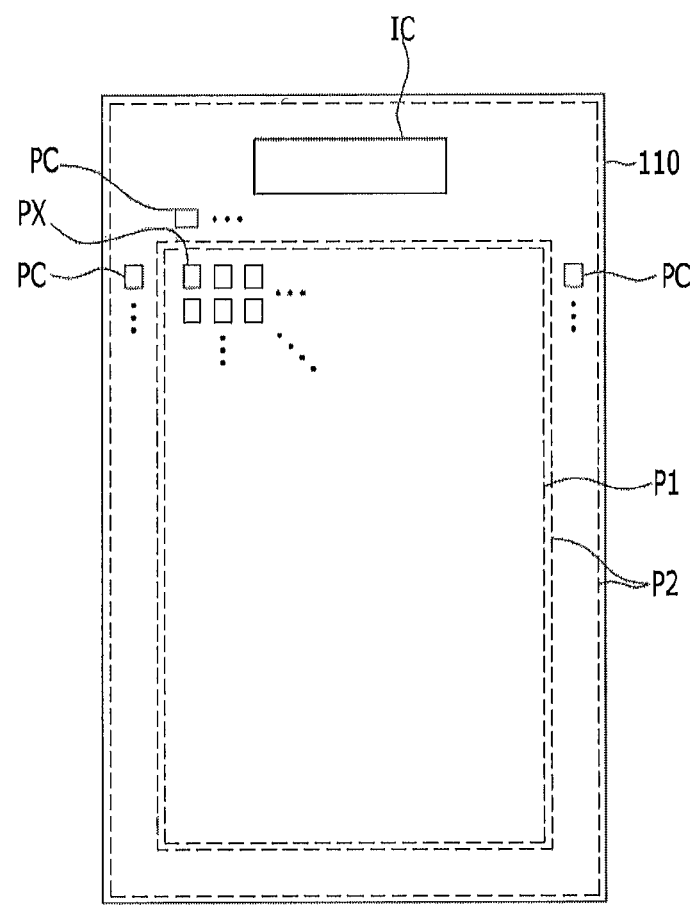
FIG. 1 is a top plan view of an OLED display according to an exemplary embodiment of the present disclosure.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Parts that are irrelevant to the description will be omitted to clearly describe the present disclosure, and the same elements will be designated by the same reference numerals throughout the specification.

In addition, the size and thickness of each configuration shown in the drawings are arbitrarily shown for understanding and ease of description, and the present disclosure is not limited thereto. In the drawings, the thickness of layers, films, panels, regions, etc., are exaggerated for clarity. In the drawings, for better understanding and ease of description, the thickness of some layers and areas is exaggerated.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements can also be present. Further, in the specification, the word "on" means positioning on or below the object portion, and does not essentially mean positioning on the upper side of the object portion based on a gravity direction.

Further, in the specification, the phrase "on a flat surface" means when an object portion is viewed from above, and the phrase "on a cross-section" means when a cross-section taken by vertically cutting an object portion is viewed from the side.

Further, the number of transistors and capacitors is not limited to the number illustrated in the accompanying drawings, and an OLED display can be formed in various structures in which one pixel can include a plurality of transistors and at least one capacitor, and is further provided with separate wiring or does not include the existing wiring. Here, the pixel is a minimum unit which displays an image, and the organic light emitting device displays an image through a plurality of pixels.

Hereinafter, an OLED display according to an exemplary embodiment of the present disclosure will be described with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a top plan view of an OLED display according to an exemplary embodiment of the present disclosure.

As shown in FIG. 1, the OLED display according to an exemplary embodiment of the present disclosure includes a pixel area P1 formed on a substrate 110 and including a plurality of pixels PX made of an OLED OLD displaying an image, and a peripheral area P2 enclosing the pixel area P1 and including a plurality of peripheral circuits PC and a driving circuit chip IC.

Next, an OLED display according to an exemplary embodiment of the present disclosure will be described.

Figure 2:
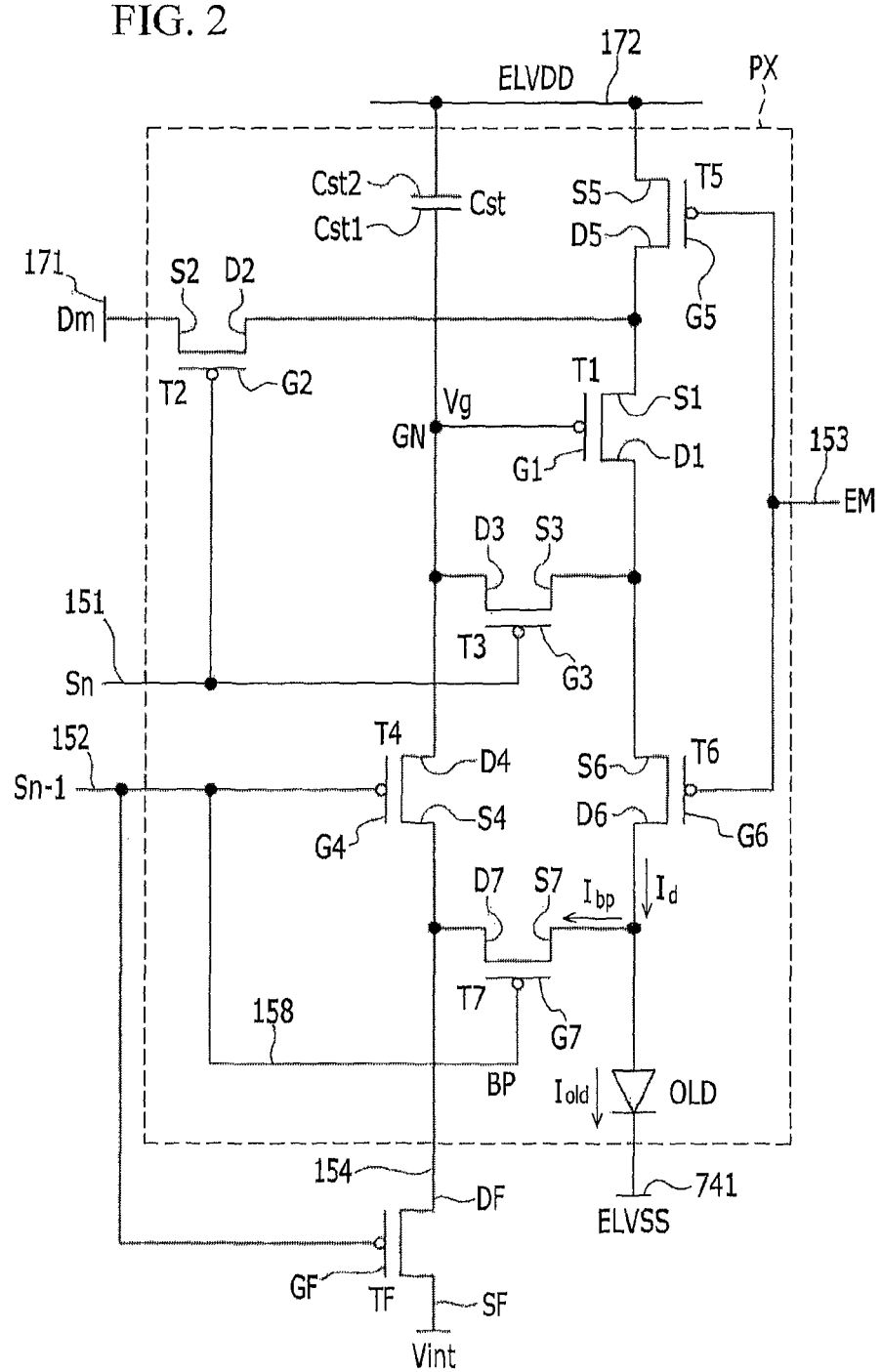
FIG. 2 is an equivalent circuit diagram of an OLED display according to an exemplary embodiment of the present disclosure.

FIG. 2 is an equivalent circuit diagram of an OLED display according to an exemplary embodiment of the present disclosure.

As shown in FIG. 2, an OLED display according to an exemplary embodiment of the present disclosure includes a plurality of signal lines 151, 152, 153, 154, 158, 171, and 172 formed throughout the pixel area PI and the peripheral area P2, and a plurality of pixels PX connected to the plurality of signal lines and arranged in an approximate matrix shape. The plurality of pixels PX are formed in the pixel area PI.

One pixel PX includes a plurality of transistors T1, T2, T3, T4, T5, T6, and T7 which are connected to the plurality of signal lines 151, 152, 153, 154, 158, 171, and 172, a storage capacitor Cst, and an OLED OLD.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 154, 158, 171, and 172 include a scan line 151 which transfers a scan signal Sn, a previous scan line 152 which transfers a previous scan signal Sn-1 to the initialization transistor T4, a light emission control line 153 which transfers a light emitting control signal EM to the operation control transistor T5 and the light emission control transistor T6, an initialization voltage line 154 which transfers an initialization voltage Vint initializing the driving transistor T1, a bypass control line 158 which transfers a bypass signal BP to the bypass transistor T7, a data line 171 which intersects the scan line 151 and transfers a data signal Dm, and a driving voltage line 172 which transfers a driving voltage ELVDD and is formed in approximately parallel with the data line 171.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED OLD via the light emission control transistor T6. The driving transistor T1 receives the data signal Dm depending on a switching operation of the switching transistor T2 to supply a driving current Id to the OLED OLD.

A gate electrode G2 of the switching transistor T2 is connected to the scan line 151, a source electrode S2 of the switching transistor T2 is connected to the data line 171, and a drain electrode D2 of the switching transistor T2 is connected to the driving voltage line 172 via the operation control transistor T5, while being connected to the source electrode S1. The switching transistor T2 is turned on depending on the scan signal Sn which is transferred through the scan line 151 to perform a switching operation of transferring the data signal Din transferred to the data line 171 to the source electrode S1 of the driving transistor T1.

A gate electrode G3 of the compensation transistor T3 is connected to the scan line 151, and a source electrode S3 of the compensation transistor T3 is connected to the anode of the OLED OLD via the light emission transistor T6 while being connected to the drain electrode D1. A drain electrode D3 of the compensation transistor T3 is connected to a drain electrode D4 of the initialization transistor T4, one terminal Cst1 of the storage capacitor Cst, and the gate electrode G1 together. The compensation transistor T3 is turned on depending on the scan signal Sn which is transferred through the scan line 151 to connect between the gate electrode G1 and the drain electrode D1 so as to diode-connect the driving transistor T1.

A gate electrode G4 of the transistor T4 is connected to the previous scan line 152, the source electrode S4 is connected to an initialization voltage line 154, and the drain electrode D4 is connected to one terminal Cst1 of the storage capacitor Cst via the drain electrode D3 and the gate electrode G1 together. The initialization transistor T4 is turned on depending on the front end scan signal Sn-1 which is transferred through the previous scan line 152 to transfer the initialization voltage Vint to the gate electrode G1 so as to perform the initialization operation which initializes a gate voltage Vg of the gate electrode G1.

A gate electrode G5 of the operation control transistor T5 is connected to the light emission control line 153, the source electrode S5 is connected to the driving voltage line 172, and the drain electrode D5 is connected to the source electrode S1 and the drain electrode S2.

A gate electrode G6 of the light emission transistor T6 is connected to the light emission control line 153, a source electrode S6 of the light emission transistor T6 is connected to the drain electrode D1 and the source electrode S3, and a drain electrode D6 of the light emission transistor T6 is electrically connected to the anode of the OLED OLD. The operation control transistor T5 and the light emission control transistor T6 are substantially simultaneously (or concurrently) turned on depending on the light emission control signal EM which is transferred through the light emission control line 153, and thus the driving voltage ELVDD is compensated by the diode-connected driving transistor T1 and then is transferred to the OLED OLD.

A gate electrode G7 of the bypass transistor T7 is connected to the bypass control line 158, a source electrode S7 of the bypass transistor T7 is connected to the drain electrode D6 of the light emission control transistor T6 and the anode of the OLED OLD together, and a drain electrode D7 of the bypass transistor T7 is connected to the initialization voltage line 154 and the source electrode S4 together.

The other terminal Cst2 of the capacitor Cst is connected to the driving voltage line 172, and a cathode of the OLED OLD is connected to a common voltage line 741 through which a common voltage ELVSS is transferred.

On the other hand, a floating transistor TF transmitting the initialization voltage Vint as a DC voltage of a predetermined magnitude to the initialization transistor T4 is formed in the peripheral area P2. A gate electrode GF of the floating transistor TF is connected to the previous scan line 152, a source electrode SF of the floating transistor TF is connected to an initialization voltage line 154, and a drain electrode DF of the floating transistor TF is connected to the source electrode S4. The floating transistor TF is turned on, depending on the previous scan signal Sn-1 transmitted through the previous scan line 152, to transmit the initialization voltage Vint transmitted to the initialization voltage line 154 to the source electrode S4. Accordingly, the initialization voltage Vint is transmitted to the initialization transistor T4 only when the previous scan signal Sn-1 is turned on.

In the exemplary embodiment of the present disclosure, the seven transistor and one capacitor structure including the bypass transistor T7 is illustrated, but the present disclosure is not limited thereto, and the number of transistors and the number of capacitors can be variously changed.

Hereinafter, a detailed operation process of one pixel of the OLED display according to the exemplary embodiment of the present disclosure will be described in detail with reference to FIG. 3.

Figure 3:
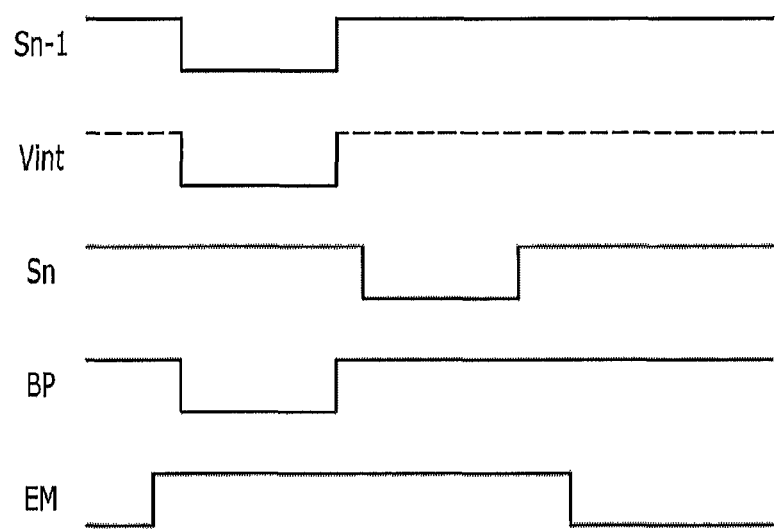
FIG. 3 is a timing diagram of a signal applied to a pixel of the OLED display according to the exemplary embodiment of the present disclosure.

FIG. 3 is a timing diagram of a signal applied to one pixel of the OLED display according to the exemplary embodiment of the present disclosure.

As illustrated in FIG. 3, the previous scan signal Sn-1 of a low level is supplied through the previous scan line 152 for an initialization period. Then, the floating transistor TF of the peripheral area P2 is turned on in response to the previous scan signal Sn-1 of the low level, and the initialization voltage Vint is transmitted to the source electrode S4 of the initialization transistor T4 from the initialization voltage line 154 through the floating transistor TF. Concurrently, the initialization transistor T4 is turned on in response to the previous scan signal Sn-1 of the low level, the initialization voltage Vint transmitted from the initialization voltage line 154 through the initialization transistor T4 is connected to the gate electrode G1 of the driving transistor T1, and the driving transistor T1 is initialized by the initialization voltage Vint.

Subsequently, the scan signal Sn of the low level is supplied through the scan line 151 during a data programming period. Then, the switching transistor T2 and the compensation transistor T3 are turned on in response to the scan signal Sn of the low level. In this case, the driving transistor T1 is diode-connected by the turned-on compensation transistor T3, and is biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode G1 of the driving transistor T1. That is, the gate voltage Vg applied to the gate electrode G1 of the driving transistor T1 is the compensation voltage Dm+Vth.

The driving voltage ELVDD and the compensation voltage Dm+Vth are applied to respective ends of the storage capacitor Cst, and a charge corresponding to a difference in a voltage between the respective ends is stored in the storage capacitor Cst.

Then, the light emission control signal EM supplied from the light emission control line 153 during the light emission period is changed from a high level to the low level. Subsequently, the operation control transistor T5 and the light emission control transistor T6 are turned on by the light emission control signal EM of the low level during the light emission period.

The driving current Id is then generated according to a difference between the gate voltage Vg of the gate electrode G1 of the driving transistor T1 and the driving voltage ELVDD, and the driving current Id is supplied to the OLED OLD through the light emission control transistor T6. A driving gate-source voltage Vgs of the driving transistor T1 is maintained at "(Dm+Vth)-ELVDD" by the storage capacitor Cst during the light emission period, and the driving current Id is proportional to a square of a value obtained by subtracting the threshold voltage Vth from the driving source-gate voltage Vgs, that is, "(Dm-ELVDD)$^2$", according to a current-voltage relationship of the driving transistor T1. Accordingly, the driving current Id is determined regardless of the threshold voltage Vth of the driving transistor T1.

In this case, the bypass transistor T7 receives the bypass signal BP from the bypass control line 158. Thus, a part of the driving current Id flows as a bypass current Ibp through the bypass transistor T7.

When the OLED OLD emits light even when a minimum current of the driving transistor T1 displaying a black image flows as a driving current, a black image is not properly displayed. Accordingly, the bypass transistor T7 of the OLED display according to the exemplary embodiment of the present disclosure can disperse a portion of the minimum current of the driving transistor T1 to a current path other than the current path of the OLED side as a bypass current Ibp. Herein, the minimum current of the driving transistor T1 means a current under the condition where the gate-source voltage Vgs of the driving transistor T1 is smaller than the threshold voltage Vth, so that the driving transistor T1 is turned off. The minimum driving current (for example, a current of about 10 pA or less) under the condition where the driving transistor T1 is turned off is transmitted to the OLED OLD to be displayed as an image of black luminance. When the minimum driving current displaying the black image flows, a bypass transmission effect of the bypass current Ibp is large, but when the large driving current displaying an image, such as a general image or a white image, flows, an effect of the bypass current Ibp is small. Accordingly, when the driving current displaying the black image flows, a light emitting current Iold of the OLED OLD, which is reduced by a current amount of the bypass current Ibp discharged from the driving current Id through the bypass transistor T7, has a minimum current amount at a level at which the black image can be clearly displayed. Accordingly, a contrast ratio can be improved by implementing a precise black luminance image by using the bypass transistor T7. In FIG. 3, the bypass signal BP is the same as the previous scan signal Sn-1, but is not limited thereto.

Hereinafter, a detailed structure of the OLED display shown in FIG. 1, FIG. 2, and FIG. 3 will be described in detail with reference to FIG. 4, FIG. 5, FIG. 6, FIG. 7, and FIG. 8.

Figure 4:
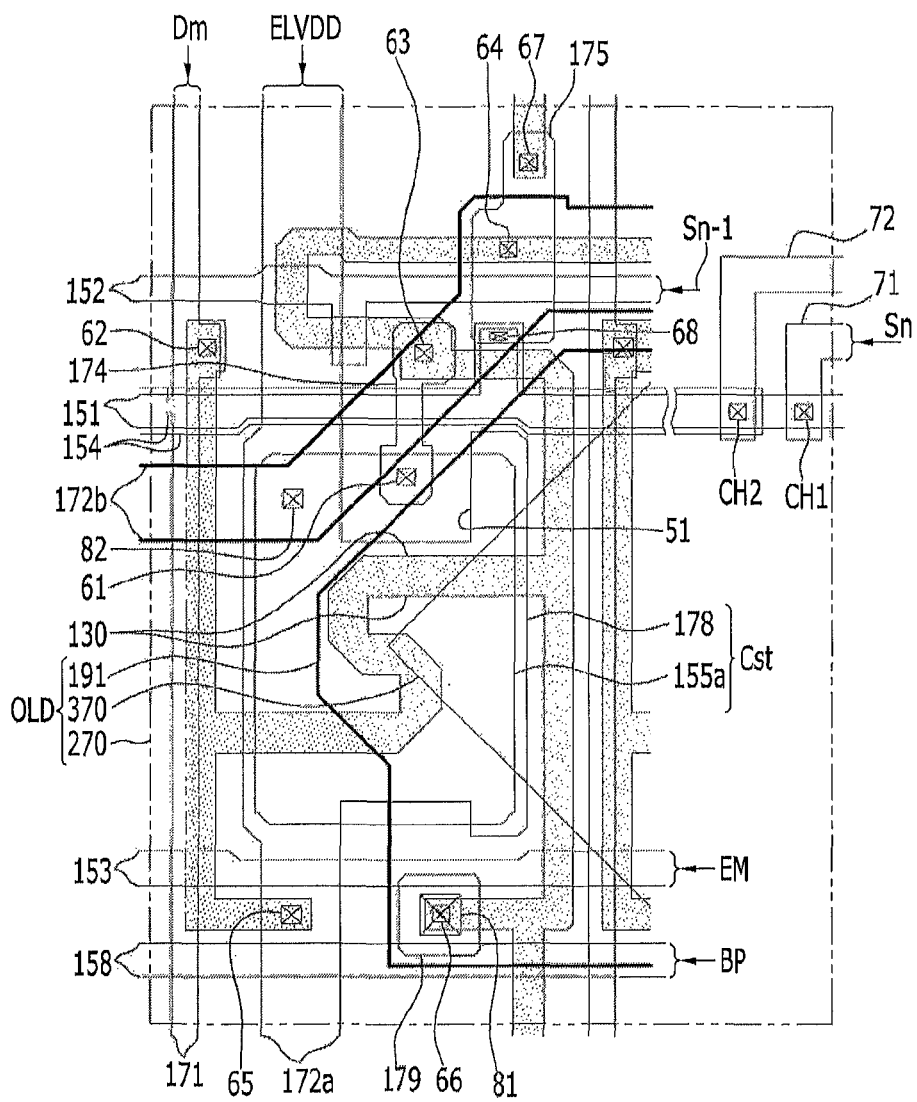
FIG. 4 is a view schematically illustrating a plurality of transistors and capacitors of the OLED display according to the exemplary embodiment of the present disclosure.
Figure 5:
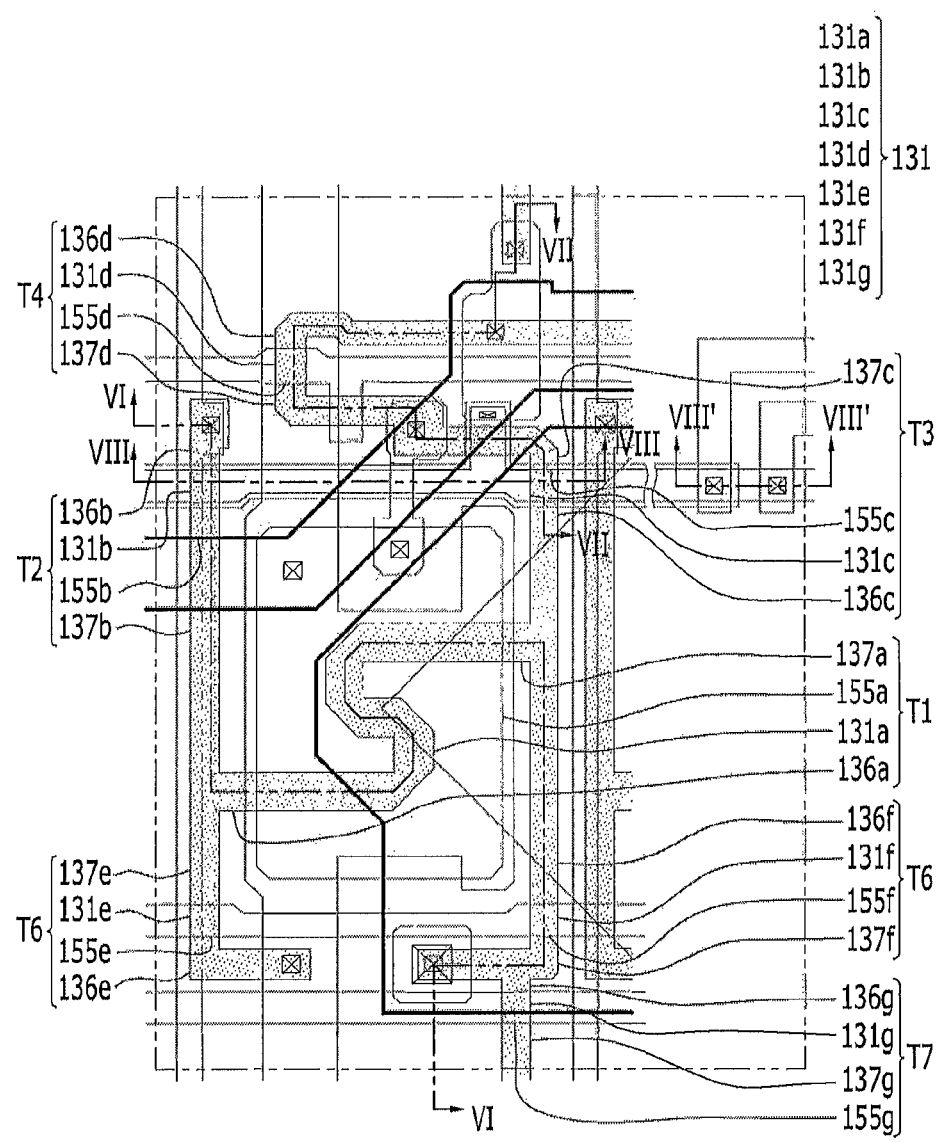
FIG. 5 is a specific layout view of FIG. 4.
Figure 6:
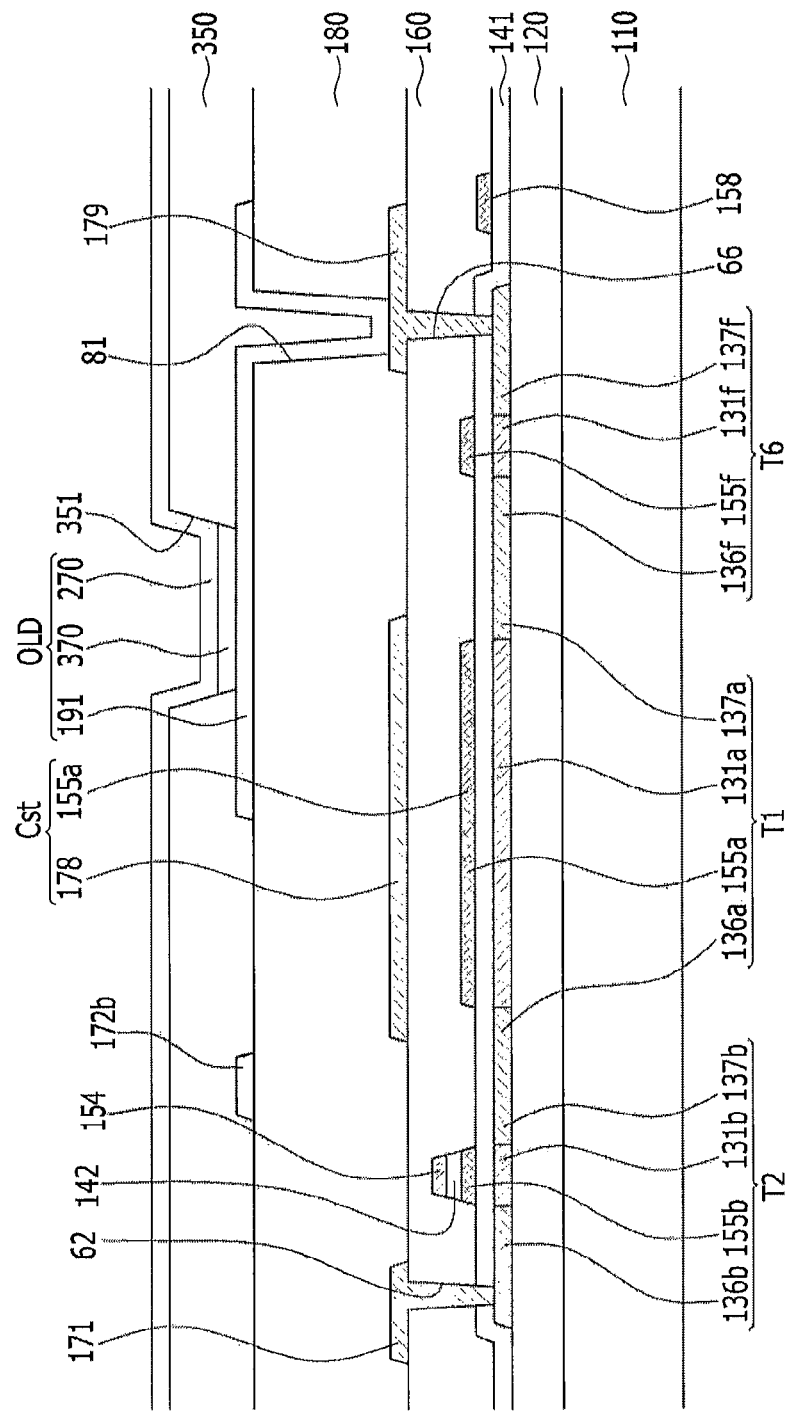
FIG. 6 is a cross-sectional view of the OLED display of FIG. 5 taken along a line VI-VI.
Figure 7:
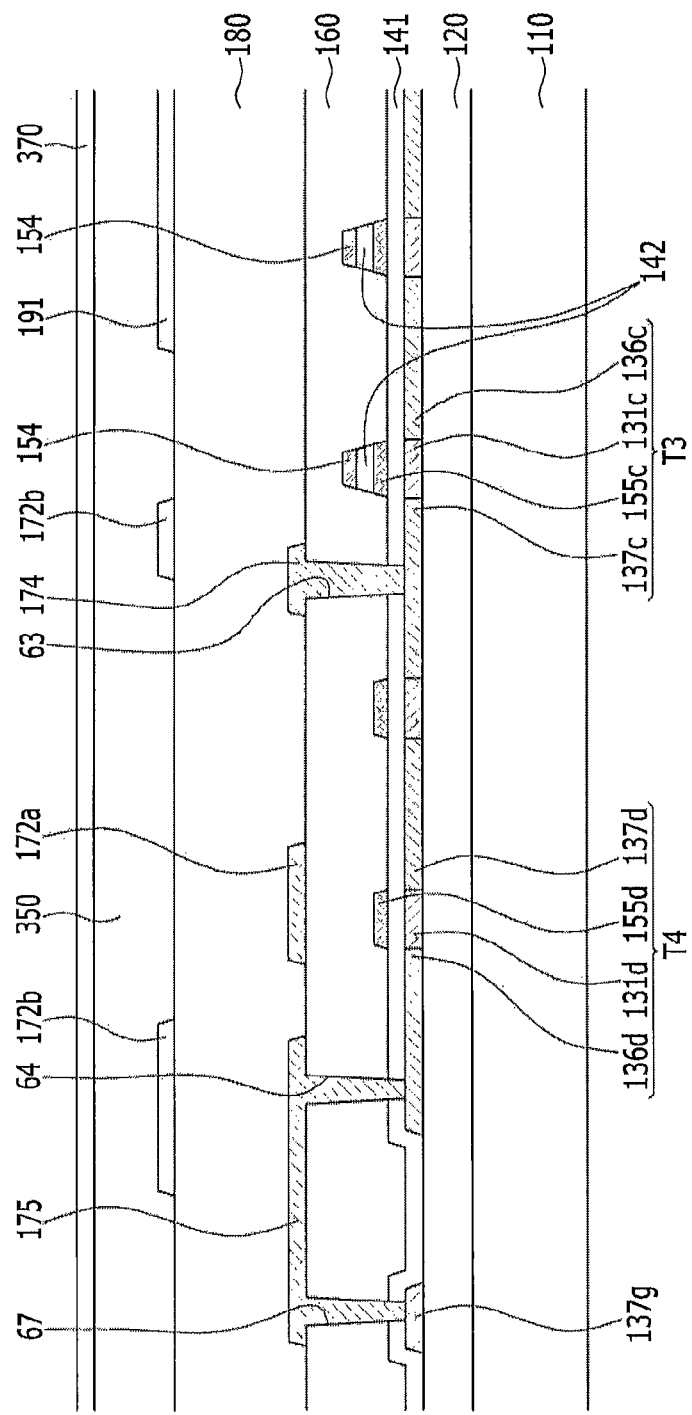
FIG. 7 is a cross-sectional view of the OLED display of FIG. 5 taken along a line VII-VII.
Figure 8:
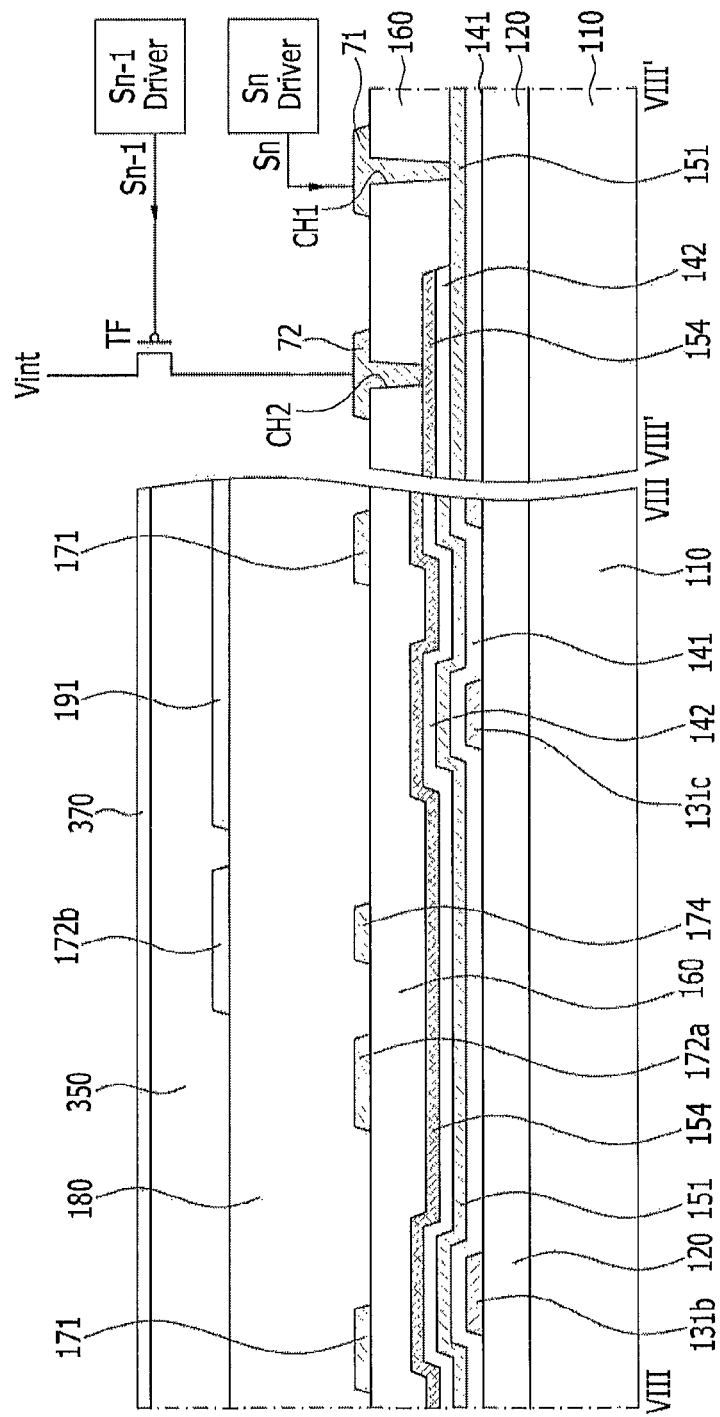
FIG. 8 is a cross-sectional view of the OLED display of FIG. 5 taken along lines VIII-VIII and FIG. 9 is a layout view of one step of a manufacturing method of an OLED display according to an exemplary embodiment of the present disclosure.

FIG. 4 is a view schematically illustrating a plurality of transistors and capacitors of the OLED display according to the exemplary embodiment of the present disclosure. FIG. 5 is a specific layout view of FIG. 4. FIG. 6 is a cross-sectional view of the OLED display of FIG. 5 taken along a line VI-VI. FIG. 7 is a cross-sectional view of the OLED display of FIG. 5 taken along a line VII-VII. FIG. 8 is a cross-sectional view of the OLED display of FIG. 5 taken along lines VIII-VIII and VIII'-VIII'.

Hereinafter, a detailed plan structure of the OLED display according to the exemplary embodiment of the present disclosure will be described in detail with reference to FIG. 4 and FIG. 5, and then a detailed cross-sectional structure of the OLED display according to the exemplary embodiment of the present disclosure will be described in detail with reference to FIG. 6, FIG. 7, and FIG. 8.

As shown in FIG. 4 and FIG. 5, the OLED display according to an exemplary embodiment of the present disclosure includes a scan line 151, a previous scan line 152, a light emission control line 153, an initialization voltage line 154, and a bypass control line 158 respectively applying the scan signal Sn, the previous scan signal Sn-1, the light emission control signal EM, the initialization voltage Vint, and the bypass signal BP and formed along the row direction. In the pixel area P1, the initialization voltage line 154 is formed on the previous scan line 152 and the initialization voltage line 154 is formed with the same pattern as the previous scan line 152.

Also, a data line 171 and a driving voltage line 172 crossing the scan line 151, the previous scan line 152, the light emission control line 153, the initialization voltage line 154, and the bypass control line 158 and respectively applying the data signal Dm and the driving voltage ELVDD to the pixel are included. The driving voltage line 172 includes a first driving voltage line 172a parallel to the data line 171 and a second driving voltage line 172b crossing the first driving voltage line 172a. The second driving voltage line 172b includes a straight portion and an oblique portion that are alternately formed. The first driving voltage line 172a and the second driving voltage line 172b are connected to each other through a contact hole 68.

Further, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the OLED OLD.

The OLED OLD includes a pixel electrode 191, an organic emission layer 370, and a common electrode 270. In this case, the compensation transistor T3 and the initialization transistor T4 are configured of a transistor having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130 which can be bent in various shapes. The semiconductor 130 can be formed of polysilicon or an oxide semiconductor. The oxide semiconductor can be formed of any one of oxides including titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as an indium-gallium-zinc oxide (InGaZnO4), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O). When the semiconductor 130 is formed of the oxide semiconductor, a separate passivation layer can be added in order to protect the oxide semiconductor which is weak to an external environment, such as a high temperature environment.

The semiconductor 130 includes a channel which is doped with an N-type impurity or a P-type impurity, and a source doping area and a drain doping area formed at respective sides of the channel and having a higher doping concentration than that of the doping impurity doped in the channel. In the present exemplary embodiment, the source doping area and the drain doping area correspond to a source electrode and a drain electrode, respectively. The source electrode and the drain electrode formed in the semiconductor 130 can be formed by doping only the corresponding areas. Further, an area between a source electrode and a drain electrode of different transistors in the semiconductor 130 is also doped, so that the source electrode and the drain electrode can be electrically connected with each other.

As illustrated in FIG. 5, the channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a is curved and can have a meandering shape or a zigzag shape. As described above, the driving channel 131a is formed in the bent shape, so that it is possible to elongate the driving channel 131a within a narrow space. Accordingly, a driving range of the driving gate-source voltage Vgs between the driving gate electrode 155a and the driving source electrode 136a is widened by the elongated driving channel 131a. Therefore, since the driving range of the driving gate-source voltage Vgs is widened, a gray of light emitted from an OLED OLD can be more finely controlled by changing a size of the gate voltage Vg applied to the driving gate electrode 155a, and as a result, it is possible to increase resolution of the OLED display and improve display quality. Various exemplary embodiments, such as a shape of "inverse S", a shape of "S", a shape of "M", and a shape of "W", of the driving channel 131a can be carried out by variously changing the shape of the driving channel 131a.

The driving gate electrode 155a overlaps the driving channel 131a, and the driving source electrode 136a and the driving drain electrode 137a are formed while being adjacent to both sides of the driving channel 131a, respectively. The driving gate electrode 155a is connected with a driving connecting member 174 through a contact hole 61.

The switching transistor T2 includes the switching channel 131b, a switching gate electrode 155b, a switching source electrode 136b, and a switching drain electrode 137b. The switching gate electrode 155b that is a part expanded from the scan line 151 downwardly overlaps the switching channel 131b, and the switching source electrode 136b and the switching drain electrode 137b are formed while being adjacent to both sides of the switching channel 131b, respectively. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c. The compensation gate electrode 155c that is a part of the scan line 151 is formed as two to prevent a leakage current, and overlaps the compensation channel 131c. The compensation source electrode 136c and the compensation drain electrode 137c are formed to be adjacent to respective sides of the compensation channel 131c. The compensation drain electrode 137c is connected to a driving connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed as two to prevent the leakage current, and overlaps the initialization channel 131d. The initialization source electrode 136d and the initialization drain electrode 137d are formed to be adjacent to respective sides of the initialization channel 131d. The initialization source electrode 136d is connected to an initialization connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are formed to be adjacent to respective sides of the operation control channel 131e. The operation control source electrode 136e is connected to a part that extends from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are formed to be adjacent to respective sides of the light emission control channel 131f. The light emission control drain electrode 137f is connected to a light emission control connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are formed to be adjacent to respective sides of the bypass channel 131g.

The bypass source electrode 136g is connected directly to the light emission control drain electrode 137f, and the bypass drain electrode 137g is connected directly to the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 formed via a second gate insulating layer 142 and an interlayer insulating layer 160 interposed therebetween. The first storage electrode 155a corresponds to the driving gate electrode 155a, and the second storage electrode 178 is an expanding region of the first driving voltage line 172a and is formed one by one for each pixel. Here, the second gate insulating layer 142 and the interlayer insulating layer 160 become a dielectric material, and a storage capacitance is determined by a charge charged to the storage capacitor Cst and a voltage between the electrodes 155a and 178. As described above, by using the driving gate electrode 155a as the first storage electrode 155a, a space for forming the storage capacitor can be obtained in the space that is decreased by the driving channel 131a occupying a large area in the pixel.

The first storage electrode 155a as the driving gate electrode 155a is connected to one end of the driving connecting member 174 through the contact hole 61 and a storage groove 51. The storage groove 51 is a groove formed in the second storage electrode 178. Accordingly, the contact hole 61 connecting one end of the driving connecting member 174 and the driving gate electrode 155a is formed inside the storage groove 51. The driving connecting member 174 is almost parallel to the data line 171 and is formed of the same layer, and the other end of the driving connecting member 174 is connected to the compensation drain electrode 137c of the compensation transistor T3 and the initialization drain electrode 137d of the initialization transistor T4 through the contact hole 63. Accordingly, the driving connecting member 174 connects the driving gate electrode 155a and the compensation drain electrode 137c of the compensation transistor T3 and the initialization drain electrode 137d of the initialization transistor T4 to each other. The driving connecting member 174 corresponds to a driving gate node GN in the equivalent circuit diagram of FIG. 1.

The second storage electrode 178 is an expansion extended from the first driving voltage line 172a. Accordingly, the storage capacitor Cst stores the storage capacitance corresponding to a difference between the driving voltage ELVDD transmitted to the second storage electrode 178 through the driving voltage line 172 and the gate voltage Vg of the driving gate electrode 155a.

The data line 171 crosses the scan line 151 and extends in a column direction, and the driving voltage line 172 is separated from the data line 171 and extends in the column direction.

The second driving voltage line 172b is connected to the first driving voltage line 172a through the contact hole 68. As described above, the driving voltage line 172 can be formed of a mesh structure by connecting the first driving voltage line 172a of the vertical direction and the second driving voltage line 172b of the horizontal direction to each other, thereby preventing the voltage drop of the driving voltage ELVDD.

The second driving voltage line 172b is not formed on the same layer as the first storage electrode 155a, but is formed on the same layer as the pixel electrode 191 such that the space to form the first storage electrode 155a can be largely obtained, thereby increasing the area of the first storage electrode 155a. Accordingly, the capacitance of the storage capacitor Cst can be improved.

The quadrangular light emission control connecting member 179 is connected with the pixel electrode 191 through a contact hole 81, and the initialization connecting member 175 is connected to the initialization voltage line 154 through a contact hole 82.

Meanwhile, in the peripheral area P2, the initialization voltage line 154 exposes the scan line 151. The exposed scan line 151 is connected to the peripheral scan connecting member 71 through the contact hole CH1, and the peripheral scan connecting member 71 is connected to a scan driver (Sn Driver) supplying the scan signal Sn. The initialization voltage line 154 is connected to a peripheral initialization connecting member 72 through the contact hole CH2, and the peripheral initialization connecting member 72 is connected to the floating transistor TF transmitting the initialization voltage Vint (referring to FIG. 8). The floating transistor TF is turned on by the previous scan driver (Sn-1 Driver) supplying the previous scan signal Sn-1 to transmit the initialization voltage Vint to the peripheral initialization connecting member 72.

In this structure, the initialization voltage Vint is transmitted to the initialization transistor T4 only when the previous scan signal Sn-1 is turned on such that the change of the scan signal Sn due to the parasitic capacitance between the initialization voltage line 154 and the scan line 151 can be prevented although the initialization voltage line 154 and the scan line 151 overlap each other in the pixel area P1.

Hereinafter, a stack sequence for a cross-sectional structure of the OLED display according to the exemplary embodiment of the present disclosure will be described in detail with reference to FIG. 6, FIG. 7, and FIG. 8.

In this case, a stack structure of the operation control transistor T5 is mostly the same as that of the light emission control transistor T6, so a detailed description thereof will be omitted.

A buffer layer 120 is formed on the substrate 110. The substrate 110 can be formed as an insulating substrate formed of glass, quartz, ceramic, plastic, and the like. The buffer layer 120 serves to block impurities from the substrate 110 to improve characteristics of polysilicon at the time of the crystallization process for forming the polysilicon and planarize the substrate 110 to mitigate stress of the semiconductor formed on the buffer layer 120. The buffer layer 120 can be made of a silicon nitride (SiNx), a silicon oxide (SiOx), or the like.

The semiconductor which includes the driving channel 131a, the switching channel 131b, the compensation channel 131c, the initialization channel 131d, the operation control channel 131e, the light emission channel 131f, and the bypass channel 131g is formed on the buffer layer 120. The driving source electrode 136a and the driving drain electrode 137a are formed at respective sides of the driving channel 131a among the semiconductor 130 and the switching source electrode 136b, and the switching drain electrode 137b are formed at respective sides of the switching channel 131b. Further, the compensation source electrode 136c and the compensation drain electrode 137c are formed at respective sides of the compensation channel 131c and the initialization source electrode 136d and the initialization drain electrode 137d are formed at respective sides of the initialization channel 131. Further, the operation control source electrode 136e and the operation control drain electrode 137e are formed at respective sides of the operation control channel 131e, and the light emission control source electrode 136f and the light emission control drain electrode 137f are formed at respective sides of the light emission control channel 131f. The bypass source electrode 136g and the bypass drain electrode 137g are formed at respective sides of the bypass channel 1.

A first gate insulating layer 141 covering the semiconductor 130 is formed thereon. The first gate insulating layer 141 can be formed of a silicon nitride (SiNx) or a silicon oxide (SiOx). On the first gate insulating layer 141, first gate wiring 151, 152, 153, 158, and 155a including a switching gate electrode 155b, a scan line 151, a compensation gate electrode 155c, a previous scan line 152 including the initialization gate electrode 155d, a light emission control line 153 including the operation control gate electrode 155e and the light emission control gate electrode 155f, a bypass control line 158 including a bypass gate electrode 155g, and a driving gate electrode (first storage electrode) 155a is formed. The first gate wiring 151, 152, 153, 158, and 155a can be formed as a multilayer in which metal layers formed of any one of copper (Cu), a copper alloy, aluminum (Al), an aluminum alloy, molybdenum (Mo), and a molybdenum alloy are stacked.

A second gate insulating layer 142 covering the first gate wiring 151, 152, 153, 158, and 155a and the first gate insulating layer 141 is formed thereon. The second gate insulating layer 142 can be formed of a silicon nitride (SiNx) or a silicon oxide (SiOx).

A second gate wire 154 including an initialization voltage line 154 is formed on the second gate insulating layer 142 with the same pattern as the scan line 151 at the position overlapping the scan line 151. The initialization voltage line 154 is formed with the same pattern as the scan line 151 in the pixel area P1 and is partially removed in the peripheral area P2 to expose the scan line 151.

An interlayer insulating layer 160 covering the second gate insulating layer 142 and the initialization voltage line 154 is formed thereon. The interlayer insulating layer 160 can be formed of a silicon nitride (SiNx) or a silicon oxide (SiOx).

The interlayer insulating layer 160 includes contact holes 61, 62, 63, 64, 65, 66, 67, 68, CH1, and CH2. On the interlayer insulating layer 160, data wiring 171, 172a, 174, 175, 178, 179, 71, and 72 including a data line 171, a first driving voltage line 172a including a second storage electrode 178, a driving connecting member 174, an initialization connecting member 175, a light emission control connecting member 179, a peripheral scan connecting member 71, and a peripheral initialization connecting member 72 is formed. The data wiring 171, 172a, 174, 175, 178, 179, 71, and 72 can be formed as a multilayer including metal layers including any one of copper (Cu), a copper alloy, aluminum (Al), an aluminum alloy, molybdenum (Mo), and a molybdenum alloy, and for example, can be formed as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 is connected to the switching source electrode 136b through the contact hole 62 formed in the first gate insulating layer 141, the second gate insulating layer 142, and the interlayer insulating layer 160, and the first driving voltage line 172a partially extends to form the second storage electrode 178.

One end of the driving connecting member 174 is connected to the first storage electrode 155a through the contact hole 61 formed in the second gate insulating layer 142 and the interlayer insulating layer 160. The other end of the driving connecting member 174 is connected to the compensation drain electrode 137c and the initialization drain electrode 137*d* through the contact hole 63 formed in the first gate insulating layer 141, the second gate insulating layer 142, and the interlayer insulating layer 160.

The center portion of the initialization connecting member 175 is connected to the initialization source electrode 136*d* through the contact hole 64 formed in the first gate insulating layer 141, the second gate insulating layer 142, and the interlayer insulating layer 160. One end of the initialization connecting member 175 is connected to the bypass drain electrode 137*g* through the contact hole 67 formed in the first gate insulating layer 141, the second gate insulating layer 142, and the interlayer insulating layer 160. The other end of the initialization connecting member 175 is connected to the initialization voltage line 154 through the contact hole 68 formed in the second gate insulating layer 142 and the interlayer insulating layer 160.

The light emission control connecting member 179 is connected to the light emission control drain electrode 137*f* through the contact hole 66 formed in the first gate insulating layer 141, the second gate insulating layer 142, and the interlayer insulating layer 160.

The peripheral scan connecting member 71 and the peripheral initialization connecting member 72 are formed in the peripheral area P2, the peripheral scan connecting member 71 is connected to the scan line 151 through the contact hole CH1 formed in the second gate insulating layer 142 and the interlayer insulating layer 160. The peripheral initialization connecting member 72 is connected to the initialization voltage line 154 through the contact hole CH2 formed in the interlayer insulating layer 160.

A passivation layer 180 covering the data wiring 171, 172*a*, 174, 175, 178, and 179 and the interlayer insulating layer 160 is formed thereon. The passivation layer 180 covers the data wiring 171, 172, 174, 175, 178, and 179 to be flattened, thereby forming the pixel electrode 191 on the passivation layer 180 without a step. The passivation layer 180 can be made of an organic material such as a polyacrylate resin and a polyimide resin, or a laminated layer of the organic material and the inorganic material.

The pixel electrode 191 and the second driving voltage line 172*b* are formed on the passivation layer 180. The light emission control connecting member 179 is connected to the pixel electrode 191 through the contact hole 81 formed in the passivation layer 180, and the second driving voltage line 172*b* is connected to the first driving voltage line 172*a* through the contact hole 82 formed in the passivation layer 180.

A pixel definition layer (PDL) 350 covering the passivation layer 180, the second driving voltage line 172*b*, and the edge of the pixel electrode 191 is formed thereon. The pixel definition layer 350 has a pixel opening 351 exposing the pixel electrode 191. The pixel definition layer 350 can be formed of an organic material such as a polyacrylate resin and a polyimide resin or a silica-based inorganic material.

An organic emission layer 370 is formed on the pixel electrode 191 exposed by the pixel opening 351, and a common electrode 270 is formed on the organic emission layer 370. The common electrode 270 is formed on the pixel definition layer 350 to be formed over the plurality of pixels PX. As such, the OLED is formed, which includes the pixel electrode 191, the organic emission layer 370, and the common electrode 270.

Here, the pixel electrode 191 is an anode which is a hole injection electrode, and the common electrode 270 is a cathode which is an electron injection electrode. However, the exemplary embodiment of the present disclosure is not limited thereto, and according to a driving method of the OLED display, the pixel electrode 191 can be the cathode, and the common electrode 270 can be the anode. Holes and the electrons are injected into the organic emission layer 370 from the pixel electrode 191 and the common electrode 270, respectively, and excitons generated by coupling of the injected holes and electrons fall from an excited state to a ground state to emit light.

The organic emission layer 370 can be formed of a low-molecular organic material or a high-molecular organic material such as poly(3,4-ethylenedioxythiophene) (PEDOT). Further, the organic emission layer 370 can be formed as a multilayer including a light emission layer, and one or more of a hole injection layer (HIL), a hole transporting layer (HTL), an electron transporting layer (ETL), and an electron injection layer (EIL). In the case where the organic emission layer includes all the layers, the HIL of the anode is formed on the pixel electrode 191 which is the anode, and the HTL, the light emitting layer, the ETL, and the EIL are sequentially laminated thereon.

The organic emission layer 370 can include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel, thereby implementing the color image. As another example, white light emitting layers emitting white light are formed on all of the red pixel, the green pixel, and the blue pixel; a red color filter, a green color filter, and a blue color filter are formed for each pixel, thereby implementing the color image. In the case of implementing the color image by using the white organic emission layer and the color filters, it is not required to use a deposition mask for depositing the red organic emission layer, the green organic emission layer, and the blue organic emission layer on respective pixels, that is, the red pixel, the green pixel, and the blue pixel.

As another example, the white organic emission layer can be formed by one organic emission layer, and also includes a configuration formed so as to emit white light by laminating a plurality of organic emission layers. For example, the white organic emission layer includes a configuration which emits white light by combining at least one yellow organic emission layer and at least one blue light emitting layer, a configuration which emits white light by combining at least one cyan organic emission layer and at least one red light emitting layer, a configuration which emits white light by combining at least one magenta organic emission layer and at least one green light emitting layer, and the like.

An encapsulation member (not illustrated) protecting the OLED OLD can be formed on the common electrode 270, and the encapsulation member can be sealed on the substrate 110 by a sealant and be formed of various materials including glass, crystal, ceramic, plastic, and metal. Meanwhile, a thin film encapsulation layer can be formed by depositing an inorganic layer and an organic layer on the common electrode 270 without using the sealant.

A manufacturing method of the OLED display according to an exemplary embodiment of the present disclosure will now be described with reference to accompanying drawings.

Figure 9:
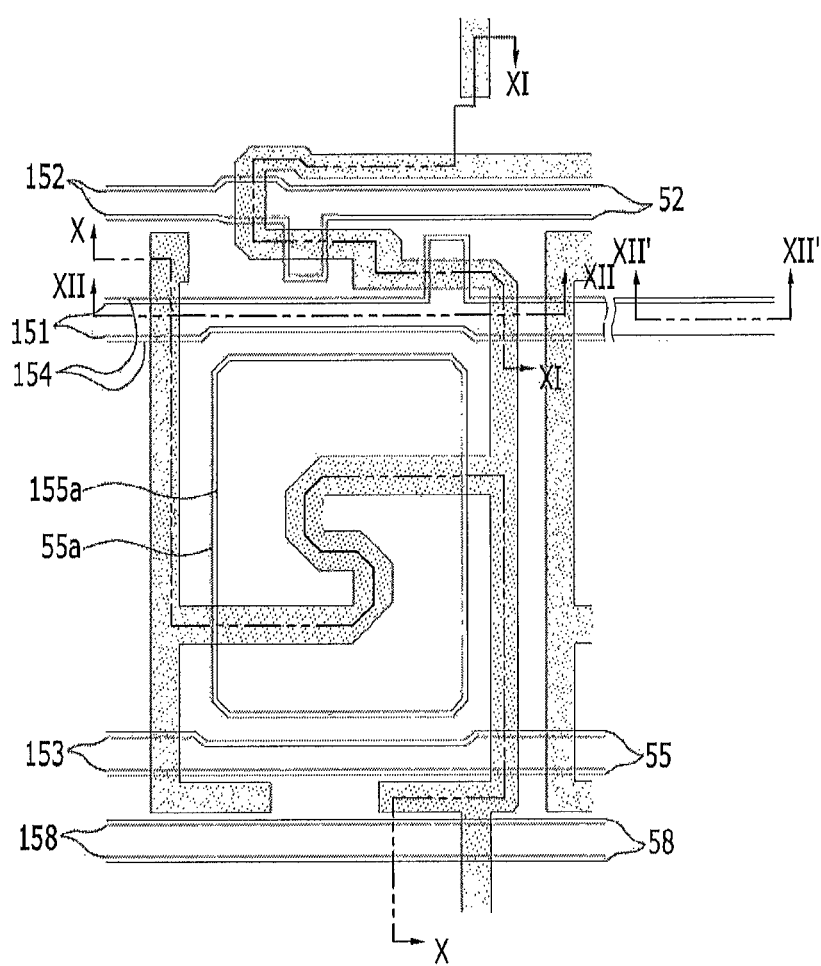
Figure 10:
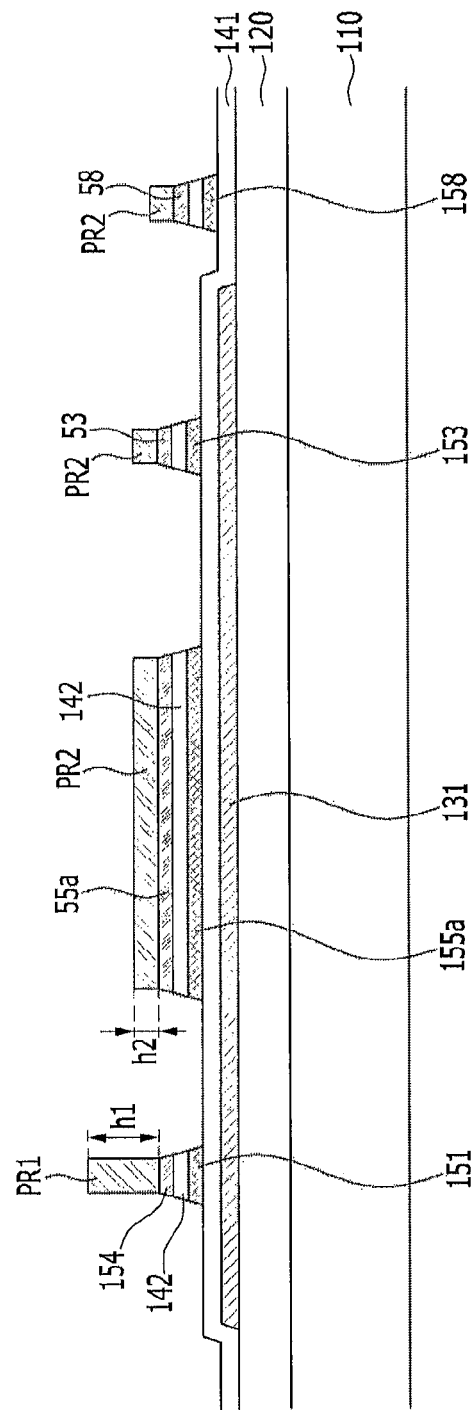
FIG. 10 is a cross-sectional view of the OLED display of FIG. 9 taken along a line X-X.
Figure 11:
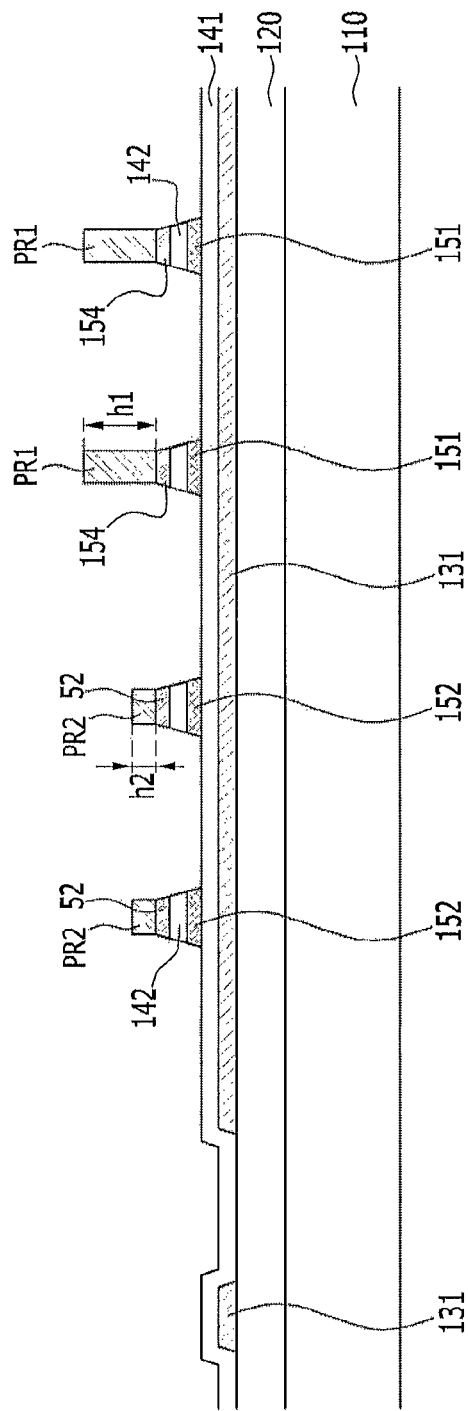
FIG. 11 is a cross-sectional view of the OLED display of FIG. 9 taken along a line XI-XI.
Figure 12:
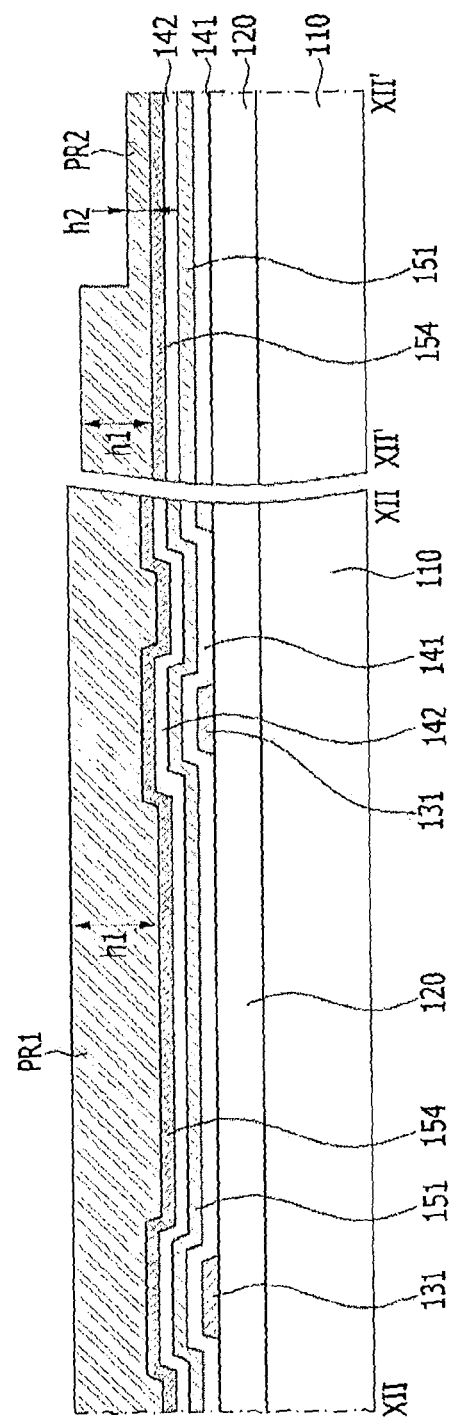
FIG. 12 is a cross-sectional view of the OLED display of FIG. 9 taken along lines XII-XII and XII'-XII'.
Figure 13:
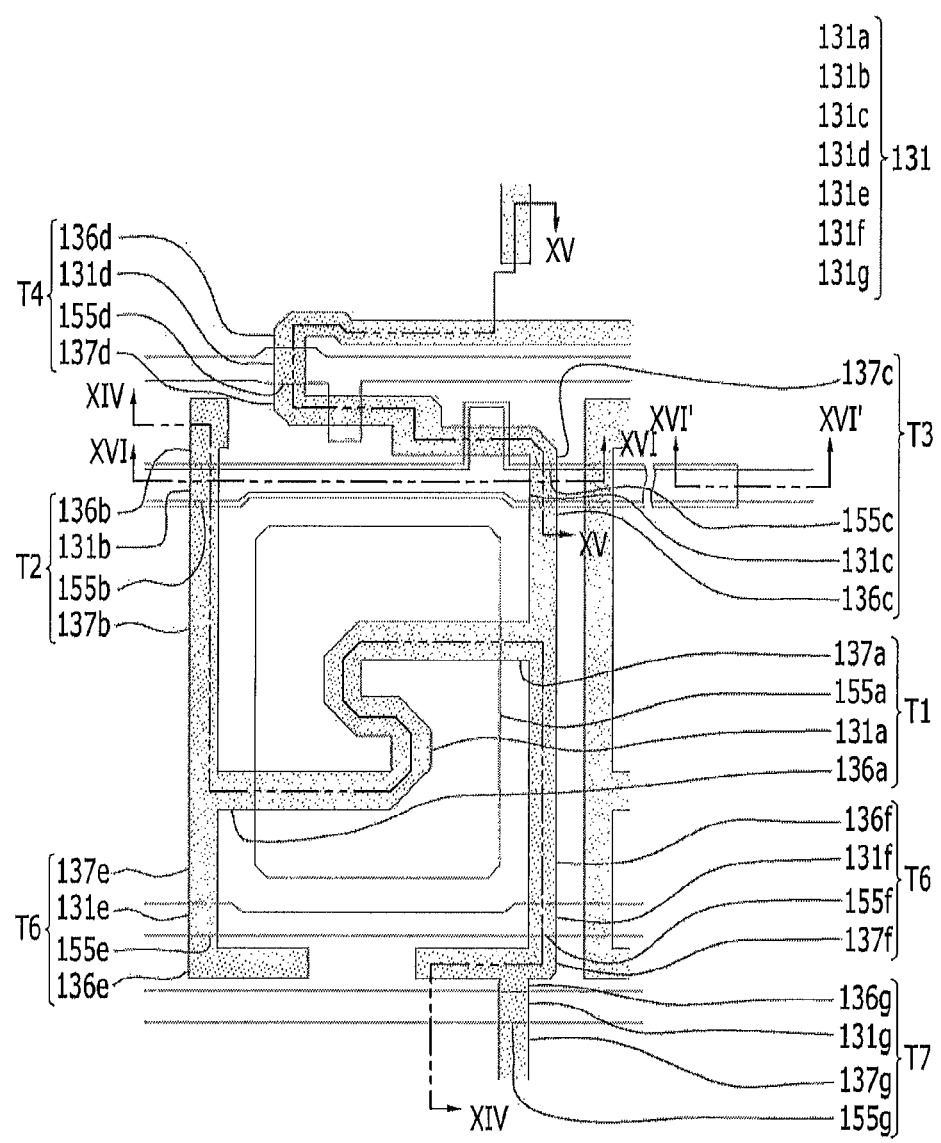
FIG. 13 is a layout view of a next step to FIG. 9.
Figure 14:
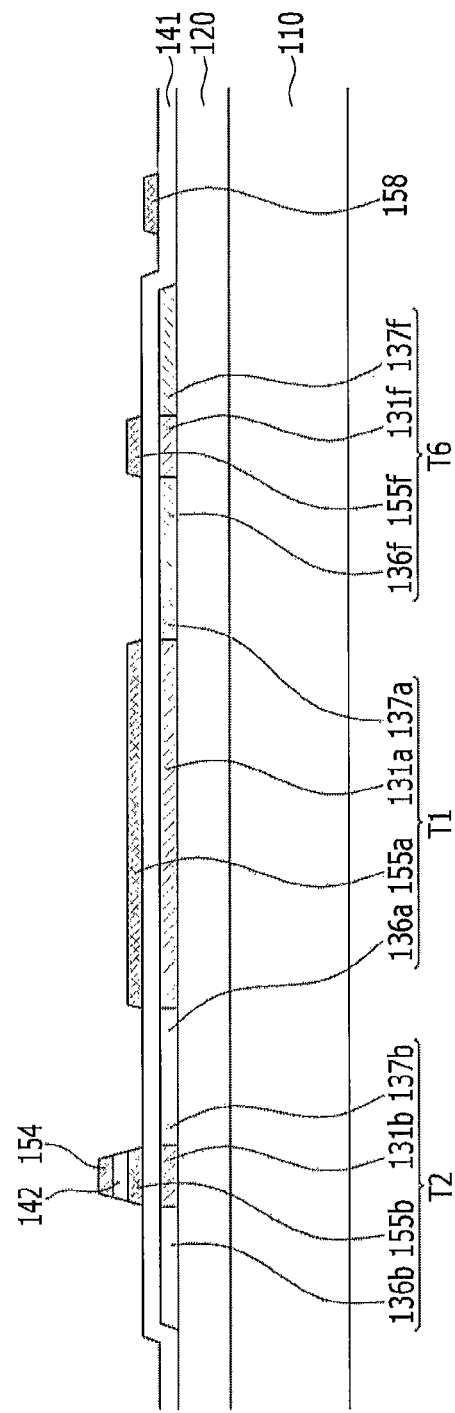
FIG. 14 is a cross-sectional view of the OLED display of FIG. 13 taken along a line XIV-XIV.
Figure 15:
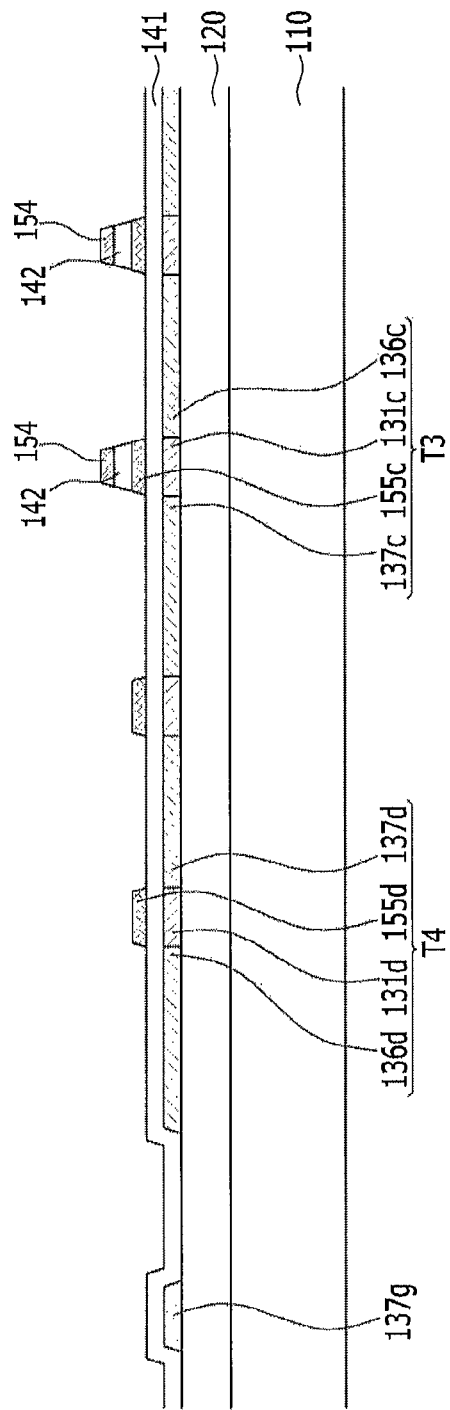
FIG. 15 is a cross-sectional view of the OLED display of FIG. 13 taken along a line XV-XV.
Figure 16:
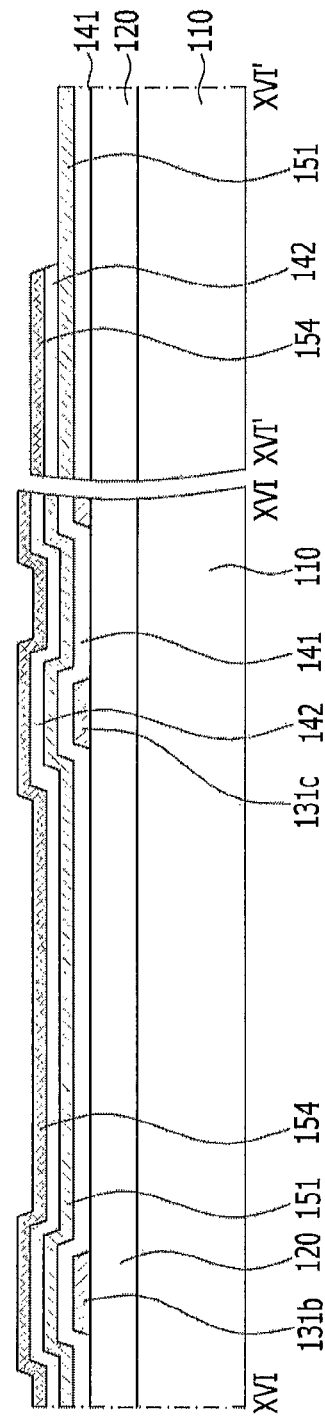
FIG. 16 is a cross-sectional view of the OLED display of FIG. 13 taken along lines XVI-XVI and XVI'-XVI'.

FIG. 9 is a layout view of one step of a manufacturing method of an OLED display according to an exemplary embodiment of the present disclosure. FIG. 10 is a cross-sectional view of the OLED display of FIG. 9 taken along a line X-X. FIG. 11 is a cross-sectional view of the OLED display of FIG. 9 taken along a line XI-XI. FIG. 12 is a cross-sectional view of the OLED display of FIG. 9 taken along lines XII-XII and XII'-XII'. FIG. 13 is a layout view of a next step to FIG. 9. FIG. 14 is a cross-sectional view of the OLED display of FIG. 13 taken along a line XIV-XIV. FIG. 15 is a cross-sectional view of the OLED display of FIG. 13 taken along a line XV-XV. FIG. 16 is a cross-sectional view of the OLED display of FIG. 13 taken along lines XVI-XVI and XVI'-XVI'.

First, as illustrated in FIG. 9, FIG. 10, and FIG. 11, the buffer layer 120 is formed on the substrate 110. The buffer layer 120 can be formed of a single layer or a staked layer of a silicon nitride and a silicon oxide, and can be deposited on a front surface of the substrate 110 by a method of plasma chemical vapor deposition (PECVD) and the like. In addition, a semiconductor layer is formed on the buffer layer 120. The semiconductor layer can be formed of a polysilicon layer or an oxide semiconductor layer, and the polysilicon layer can be formed by a method of forming an amorphous silicon layer and then crystallizing the amorphous silicon layer. Various known methods can be applied as the crystallizing method, and for example, the amorphous silicon layer is crystallized by using heat, laser, Joule heat, an electric field, a catalyst metal, or the like. Further, the semiconductor layer is patterned into the semiconductor 130 having the form illustrated in FIG. 9 by performing a photolithography process using a first mask on the semiconductor layer. In this case, the semiconductor 130 is not doped, so that the semiconductor 130 is not divided into the channel, the source electrode, and the drain electrode configuring each transistor.

Also, a first gate insulating layer 141 covering the buffer layer 120 and the semiconductor 130 is formed thereon. Next, a first gate metal layer is deposited on the first gate insulating layer 141. Also, a second gate insulating layer 142 is formed on the first gate metal layer. The first gate insulating layer 141 and the second gate insulating layer 142 are formed by depositing a silicon nitride (SiNx) or a silicon oxide (SiOx) on a front surface thereof by a method of plasma chemical vapor deposition (PECVD) and the like. The second gate metal layer is deposited on the second gate insulating layer 142. The first gate metal layer and the second gate metal layer can be formed of a multilayer in which a metal layer including any one of copper (Cu), a copper alloy, aluminum (Al), and an aluminum alloy, and a metal layer including any one of molybdenum (Mo) and a molybdenum alloy, is stacked.

Further, the first gate metal layer and the second gate metal layer are simultaneously patterned by an etching process using a second mask as a half-tone mask.

A photosensitive film is formed on the second gate metal layer. By exposing the photosensitive film by using a second mask as the half-tone mask, the photosensitive film includes a first photosensitive film PR1 formed in a region corresponding to the scan line 151 of the pixel area P1 and a second photosensitive film PR2 formed in a region corresponding to the previous scan line 122, the light emission control line 123, the bypass control line 158, and the driving gate electrode 125a and the region corresponding to the scan line 151 of the peripheral area P2. The thickness h1 of the first photosensitive film PR1 is greater than the thickness h2 of the second photosensitive film PR2.

By concurrently etching the first gate metal layer and the second gate metal layer by using the photosensitive film as an etching mask, the scan line 151 and the initialization voltage line 154 are formed with the same pattern, the previous scan line 152 and an upper previous scan line 52 are formed with the same pattern, the light emission control line 153 and an upper light emission control line 53 are formed with the same pattern, the bypass control line 158 and an upper bypass control line 58 are formed with the same pattern, and the driving gate electrode 155a and an upper driving gate electrode 55a are formed with the same pattern.

Next, as shown in FIG. 13, FIG. 14, FIG. 15, and FIG. 16, an ashing process is performed to remove the second photosensitive film PR2, thereby exposing the upper previous scan line 52, the upper light emission control line 53, the upper bypass control line 58, and the upper driving gate electrode 55a. In this case, the part of the initialization voltage line 154 formed in the peripheral area P2 is exposed.

Further, by using the first photosensitive film PR1 reduced in thickness by the ashing process as the etching mask, the part of the initialization voltage line 154 formed in the peripheral area P2 is etched, and the upper previous scan line 52, the upper light emission control line 53, the upper bypass control line 58, and the upper driving gate electrode 55a are etched.

As a result, a first gate wire including a scan line 151, a previous scan line 152, a light emission control line 153, a bypass control line 158, a driving gate electrode 155a, and a second gate wire including an initialization voltage line 154, remain.

As described above, the first gate wire and the second gate wire are simultaneously or concurrently formed by using one second mask such that the manufacturing cost is reduced.

Further, after removing the first photosensitive film PR1, the semiconductor 130 is doped with the impurity. The semiconductor 130 is doped into the exposed region except for the portion covered by the switching gate electrode 155b, the compensation gate electrode 155c, the initialization gate electrode 155d, the operation control gate electrode 155e, the light emission control gate electrode 155f, the bypass gate electrode 155g, and the driving gate electrode 155a. As a result, the source electrode and the drain electrode of each transistor are formed. The channels of each transistor are formed in the region that is covered and is not doped in the semiconductor 130. That is, the driving channel 131a, the switching channel 131b, the compensation channel 131c, the initialization channel 131d, the operation control channel 131e, the light emission control channel 131f, and the bypass channel 131g are simultaneously or concurrently formed. As described above, when the source and drain doping is performed on the semiconductor 130, a separate mask is not required.

Next, as shown in FIG. 4, FIG. 5, FIG. 6, FIG. 7, and FIG. 8, an interlayer insulating layer 160 covering the second gate insulating layer 142 and the initialization voltage line 154 is formed thereon. In addition, the first gate insulating layer 141, the second gate insulating layer 142, and the interlayer insulating layer 160 are patterned by the photolithography using a third mask to form a plurality of contact holes 61, 62, 63, 64, 65, 66, 67, 68, CH1, and CH2.

A data metal layer is also formed on the interlayer insulating layer 160. The data metal layer can be formed of a multilayer in which a metal layer including any one of copper, a copper alloy, aluminum, an aluminum alloy, molybdenum, and a molybdenum alloy are stacked. For example, the data metal layer can be formed of a triple layer of titanium/aluminum/titanium (Ti/Al/Ti), molybdenum/aluminum/molybdenum (Mo/Al/Mo), or molybdenum/copper/molybdenum (Mo/Cu/Mo).

Then, the data metal layer is patterned by a photolithography process using a fourth mask. Accordingly, on the interlayer insulating layer 160, data wiring including a data line 171, a first driving voltage line 172a including the second storage electrode 178, a driving connecting member 174, an initialization connecting member 175, a light emission control connecting member 179, a peripheral scan connecting member 71, and a peripheral initialization connecting member 72 is formed. As described above, the second storage electrode 178 is formed of the same material and the same layer as the first driving voltage line 172a and the data line 171 such that it is not required to form the second storage electrode as a separate layer, thereby reducing the number of masks used in the manufacturing process.

Also, the passivation layer 180 covering the data wiring 171, 172a, 174, 175, 178, 179, 71, and 72 is formed on the interlayer insulating layer 160 and is patterned by the photolithography process using a fifth mask to form the contact holes 81 and 82. A pixel electrode layer is formed on the passivation layer 180 and is patterned by the photolithography process using a sixth mask. Accordingly, the pixel electrode 191 connected to the light emission control connecting member 179 through the contact hole 81 and a second driving voltage line 172b connected to the first driving voltage line 172a through the contact hole 82 are formed on the passivation layer 180. A pixel definition layer 350 covering the pixel electrode 191 and the second driving voltage line 172b is formed on the passivation layer 180, and a pixel opening 351 exposing the part of the pixel electrode 191 is formed in the pixel definition layer 350 by using a seventh mask. Also, an organic emission layer 370 is formed on the pixel electrode 191 exposed through the pixel opening 351 of the pixel definition layer 350. A common electrode 270 is formed on the organic emission layer 370 to complete the OLED OLD. The common electrode 270 is formed throughout the entire region including the pixel definition layer 350, thereby eliminating a separate mask.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate including a pixel area configured to display an image and a peripheral area surrounding the pixel area;
   a scan line formed over the substrate and configured to provide a scan signal;
   an initialization voltage line having substantially the same pattern as the scan line and insulated from the scan line;
   a data line crossing the scan line and configured to provide a data voltage;
   a driving voltage line crossing the scan line and configured to provide a driving voltage;
   a switching transistor electrically connected to the scan line and the data line;
   a driving transistor electrically connected to the switching transistor and including a driving gate electrode;
   a storage capacitor including a first storage electrode and a second storage electrode overlapping the first storage electrode, wherein the first storage electrode and the driving gate electrode are integrally formed, and wherein the second storage electrode extends from the driving voltage line; and
   an OLED electrically connected to the driving transistor, wherein the initialization voltage line is configured provide an initialization voltage to initialize the driving transistor, and wherein the initialization voltage line is formed with the same pattern as the scan line in the pixel area and exposes at least a first portion of the scan line in the peripheral area.

2. The OLED display of claim 1, further comprising:
   a first gate insulating layer formed over the substrate; and
   a second gate insulating layer formed over a second portion of the scan line formed over the first gate insulating layer,
   wherein the initialization voltage line is formed over the second gate insulating layer.

3. The OLED display of claim 2, further comprising an interlayer insulating layer formed over the second gate insulating layer and the initialization voltage line, wherein the second storage electrode, the driving voltage line, and the data line are formed over the interlayer insulating layer.

4. The OLED display of claim 1, wherein the driving voltage line includes a first driving voltage line substantially parallel to the data line and a second driving voltage line crossing the data line, wherein the first driving voltage line is formed on the same layer as the data line, and wherein the second driving voltage line is formed on a different layer than the scan line.

5. The OLED display of claim 4, wherein the OLED includes:
   a pixel electrode electrically connected to the driving transistor;
   an organic emission layer formed over the pixel electrode; and
   a common electrode formed over the organic emission layer,
   wherein the second driving voltage line is formed on the same layer as the pixel electrode.

6. The OLED display of claim 4, further comprising:
   a previous scan line formed on the same layer as the scan line and configured to provide a previous scan signal; and
   a floating transistor formed in the peripheral area and configured to be turned on based on the previous scan signal so as to provide the initialization voltage.

7. The OLED display of claim 6, further comprising a peripheral initialization connecting member connecting the drain electrode of the floating transistor to the initialization voltage line, wherein the peripheral initialization connecting member is formed on the same layer as the data line.

8. The OLED display of claim 1, further comprising a semiconductor formed over the substrate and including a switching channel of the switching transistor and a driving channel of the driving transistor electrically separated from each other, wherein the driving channel overlaps the driving gate electrode, and wherein the driving channel is curved.

9. A method for manufacturing an organic light-emitting diode display comprising:
   sequentially depositing a first gate insulating layer, a first gate metal layer, a second gate insulating layer, and a second gate metal layer over a substrate;
   etching the first gate metal layer and second gate metal layer with a first half-tone mask to concurrently form a scan line, a first storage electrode, and an initialization voltage line;

forming an interlayer insulating layer over the initialization voltage line and the second gate insulating layer;
forming a data line, a first driving voltage line, and a second storage electrode over the interlayer insulating layer;
forming a passivation layer over the data line, the first driving voltage line, and the second storage electrode; and
forming an OLED over the passivation layer, wherein a portion of the initialization voltage line formed over the scan line is formed having substantially the same pattern as the scan line and exposes at least a first portion of the scan line in the peripheral area.

10. The method of claim 9, wherein the substrate includes a pixel area configured to display an image and a peripheral area surrounding the pixel area, and
wherein the etching includes:
forming a first photosensitive film in a region corresponding to the scan line of the pixel area;
forming a second photosensitive film in a region corresponding to the driving gate electrode and a region corresponding to a portion of the scan line of the peripheral area with a second half-tone mask;
concurrently etching the first gate metal layer and the second gate metal layer with the first photosensitive film and the second photosensitive film as an etching mask to form the scan line and the initialization voltage line having substantially the same pattern;
removing the second photosensitive film; and
etching the second gate metal layer with the first photosensitive film as an etching mask to etch a portion of the initialization voltage line formed in the peripheral area.

11. The method of claim 10, wherein the thickness of the first photosensitive film is greater than the thickness of the second photosensitive film.

12. The method of claim 10, wherein forming the OLED includes:
forming a pixel electrode over the passivation layer;
forming an organic emission layer over the pixel electrode; and
forming a common electrode on the organic emission layer,
wherein a second driving voltage line crossing the first driving voltage line is formed during the forming of the pixel electrode, and
wherein the first driving voltage line and the second driving voltage line are electrically connected to each other.

13. The method of claim 12, wherein the second driving voltage line and the pixel electrode are formed on the same layer.

14. The method of claim 12, wherein the second driving voltage line and the scan line are formed on different layers.

15. An organic light-emitting diode (OLED) display, comprising:
a substrate;
a driving voltage line formed over the substrate and configured to provide a driving voltage;
a storage capacitor including a first storage electrode and a second storage electrode overlapping the first storage electrode, wherein the second storage electrode extends from the driving voltage line;
a driving transistor electrically connected to a data line and the driving voltage line and including a driving gate electrode, wherein the first storage electrode and the driving gate electrode are integrally formed; and
an OLED electrically connected to the driving transistor and including a pixel electrode,
wherein the driving voltage line includes a first driving voltage line and a second driving voltage line formed over the first driving voltage line, and wherein the second driving voltage line is formed on the same layer as the pixel electrode.

16. The OLED display of claim 15, wherein the substrate includes a pixel area and a peripheral area surrounding the pixel area, and wherein the OLED display further comprises:
a switching transistor electrically connected the data line;
a scan line electrically connected to the switching transistor and configured to provide a scan signal to the switching transistor; and
an initialization voltage line having substantially the same pattern as the scan line and insulated from the scan line, wherein the initialization voltage line is configured provide an initialization voltage to initialize the driving transistor, and wherein the initialization voltage line exposes at least a first portion of the scan line in the peripheral area.

17. The OLED display of claim 16, further comprising:
a first gate insulating layer formed over the substrate; and
a second gate insulating layer formed over a second portion of the scan line formed over the first gate insulating layer,
wherein the initialization voltage line is formed over the second gate insulating layer.

18. The OLED display of claim 16, wherein the first driving voltage line is formed on the same layer as the data line, and wherein the second driving voltage line is formed on a different layer than the scan line.

19. The OLED display of claim 16, further comprising:
a previous scan line formed on the same layer as the scan line and configured to provide a previous scan signal; and
a floating transistor formed in the peripheral area and configured to be turned on based on the previous scan signal so as to provide the initialization voltage.

20. The OLED display of claim 19, further comprising a peripheral initialization connecting member connecting the drain electrode of the floating transistor to the initialization voltage line, wherein the peripheral initialization connecting member is formed on the same layer as the data line.

* * * * *